United States Patent
Luh et al.

(10) Patent No.: US 7,202,708 B2
(45) Date of Patent: Apr. 10, 2007

(54) COMPARATOR WITH RESONANT TUNNELING DIODES

(75) Inventors: Louis Luh, San Gabriel, CA (US); Keh-Chung Wang, Thousand Oaks, CA (US)

(73) Assignee: Raytheon Company, Waltham, MA (US)

( * ) Notice: Subject to any disclaimer, the term of this patent is extended or adjusted under 35 U.S.C. 154(b) by 90 days.

(21) Appl. No.: 11/076,621

(22) Filed: Mar. 10, 2005

(65) Prior Publication Data

US 2006/0202720 A1    Sep. 14, 2006

(51) Int. Cl.
*H03K 5/22* (2006.01)
*H03K 5/153* (2006.01)

(52) U.S. Cl. .............................. 327/77; 327/65; 327/89

(58) Field of Classification Search ................. None
See application file for complete search history.

(56) References Cited

U.S. PATENT DOCUMENTS

| | | | | |
|---|---|---|---|---|
| 4,147,943 | A | * 4/1979 | Peterson | 327/65 |
| 5,140,188 | A | * 8/1992 | Burns | 327/78 |
| 5,889,487 | A | 3/1999 | Burns et al. | |
| 6,157,220 | A | * 12/2000 | Broekaert | 327/65 |
| 6,252,430 | B1 | * 6/2001 | van der Wagt et al. | 327/55 |

* cited by examiner

*Primary Examiner*—Tuan T. Lam
(74) *Attorney, Agent, or Firm*—Leonard A. Alkov

(57) ABSTRACT

A comparator uses two resonant tunneling diodes (RTDs) in series with resistors of the latch element of the comparator. By inserting two RTD diodes in series with resistors, the negative resistance of the first and the second RTD diodes reduces the effective RC time constants of the resistors and latch, leading to a faster regeneration during a latching mode of the comparator than achieved with alternative designs.

19 Claims, 9 Drawing Sheets

COMPARATOR WITH RESONANT TUNNELING DIODES

FIELD

The present application relates to comparator circuits. More particularly, it relates to a high-speed analog voltage comparator having resonant tunneling diodes to minimize its RC time constants and provide faster regeneration.

BACKGROUND

In the usual prior art implementation of a clocked latching comparator, a clock signal switches the comparator between a sample mode and a latching mode. In the sample mode, the comparator has relatively low gain and the output follows the signal input. When the comparator is clocked into the latching mode, positive feedback is enabled so that an arbitrary small signal will regenerate and drive the latch to its full output swing, such that the signal is correctly resolved by subsequent logic.

FIG. 1 and FIG. 2 show a comparator circuit proposed by Albert E. Cosand (U.S. Pat. No. 6,597,303), utilizing transistors and resistors for regeneration. Although it is desirable to provide faster regeneration, the regeneration time of the comparator circuit of FIG. 1 and FIG. 2 is limited by an RC time constant determined by the resistance (R, including resistors and parasitic resistance) and the parasitic capacitance of the transistors (C). The value of the RC time constant in seconds is equal to the product of the circuit resistance in ohms and the circuit capacitance in farads, expressed mathematically as t=RC.

SUMMARY

An analog voltage comparator has resonant tunneling diodes in series with resistors of its cross-coupled regenerative latch circuit. The resonant tunneling diodes have negative resistance that effectively cancels part of the resistance component of RC circuit delay.

In one embodiment, the cross-coupled regenerative latch circuit includes first and second tunnel-diode/resistor pairs. The cross-coupled regenerative latch circuit includes first and second bipolar transistors, where (a) the collector of the first bipolar transistor and the base of the second bipolar transistor connect to the first tunnel-diode/resistor pair, (b) the collector of the second bipolar transistor and the base of the first bipolar transistor connect to the second tunnel-diode/resistor pair, and (c) the emitter of the first bipolar transistor connects to the emitter of the second bipolar transistor.

In another embodiment, the bipolar transistors are replaced with n-channel metal-oxide-semiconductor field-effect (NMOS-FET) transistors.

DETAILED DESCRIPTION

Figure 1:
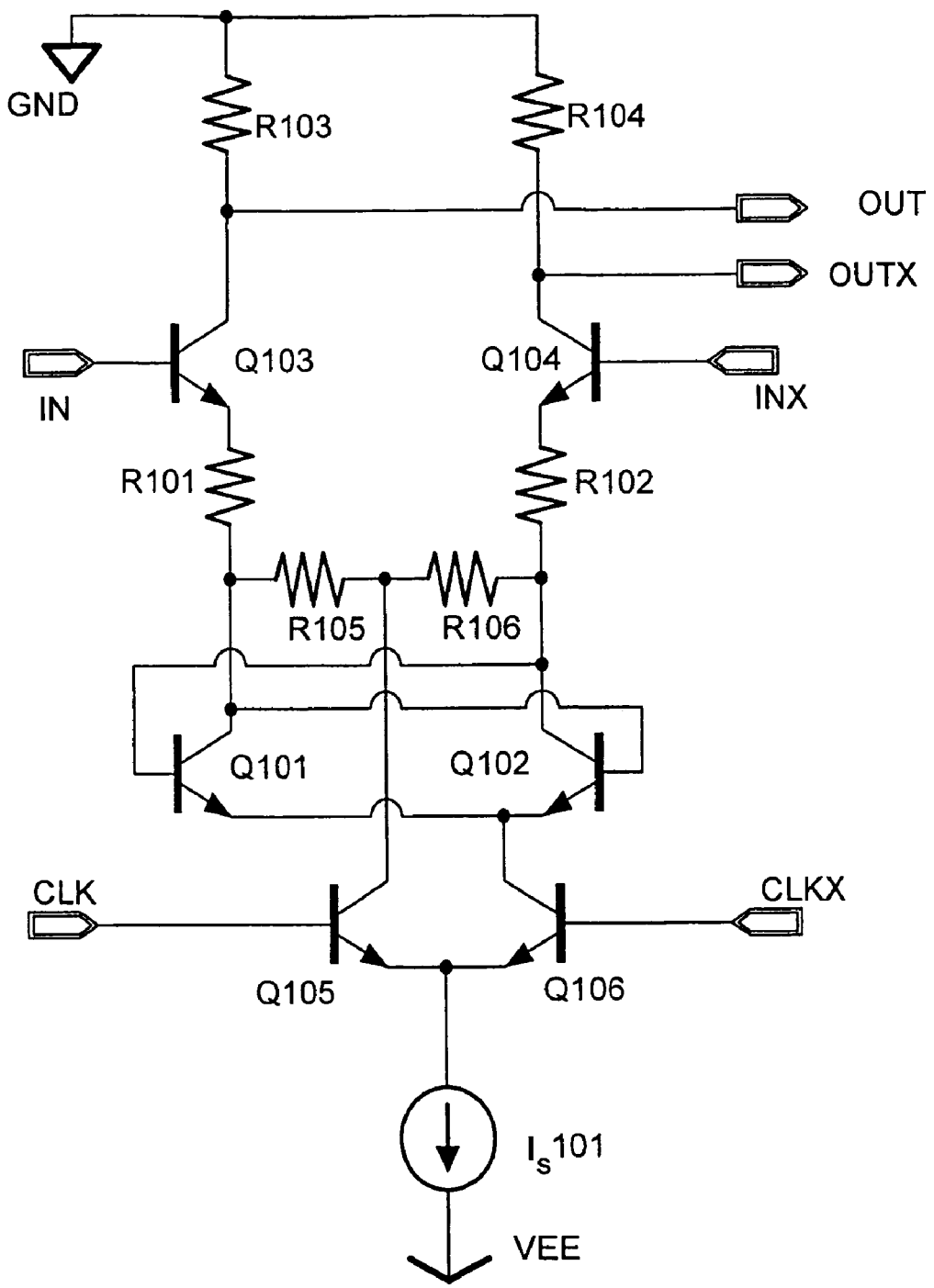
FIG. 1 shows a prior art comparator circuit.
Figure 2:
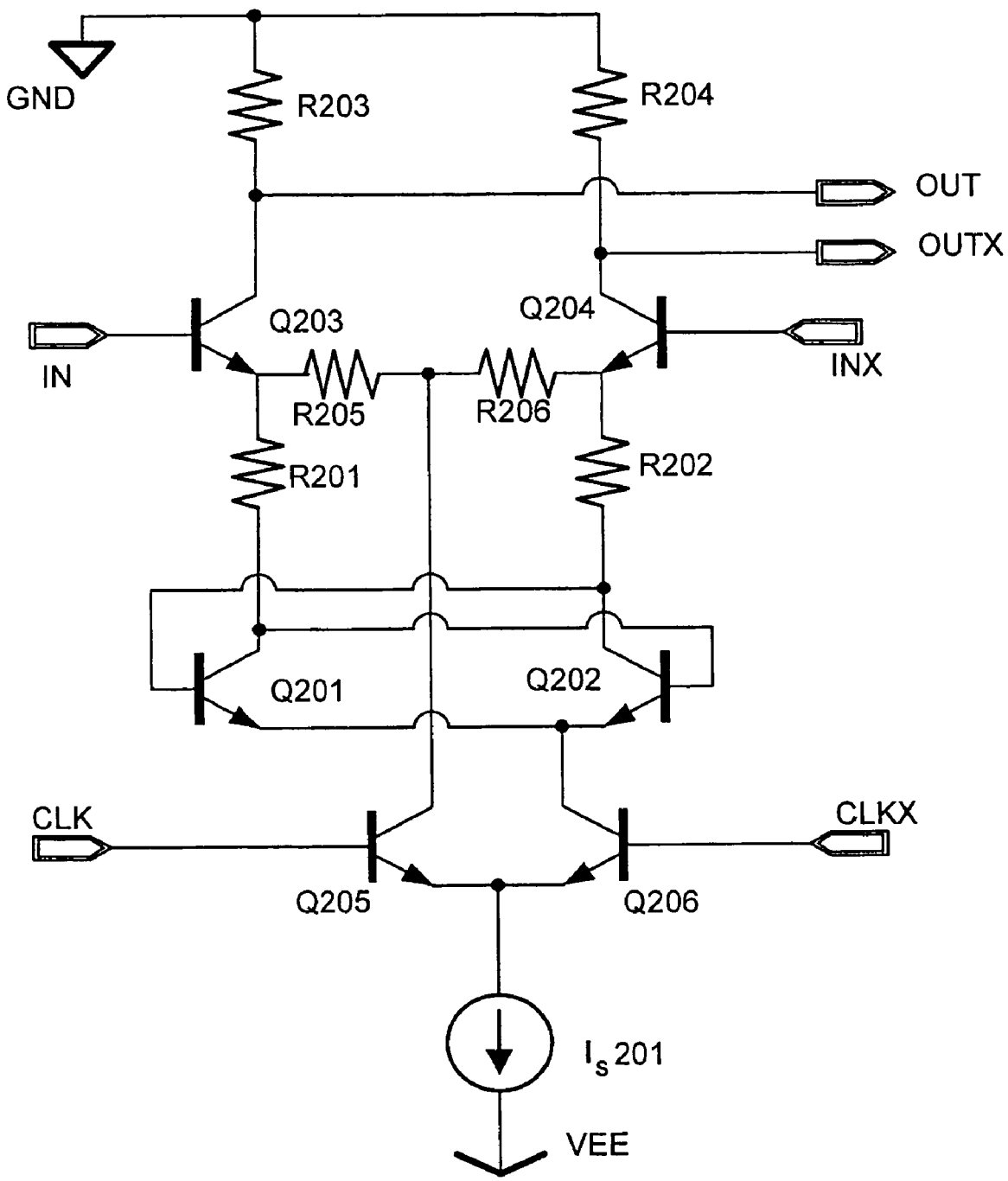
FIG. 2 shows another prior art comparator circuit.

FIG. 1 and FIG. 2 illustrate the prior art comparator circuits of U.S. Pat. No. 6,597,303.

In the prior art comparator of FIG. 1, the basic regenerative loop, or latching circuit, includes cross-coupled transistors Q101, Q102 and resistors R101 and R102.

During sample mode, input signals IN and INX are input into the base of transistors Q103 and Q104, respectively. Output signals OUT and OUTX are taken from the collectors Q103 and Q104, respectively. The input voltage difference at the bases of Q103 and Q104 is coupled into resistors R101 and R102 to become the initial input voltage of the latching circuit upon transition from sample mode to latching mode. During sample mode, current from current source $I_S$101 passes through switching transistor Q105 and degenerate resistors R105 and R106 to provide voltage gain from input to output. Transition from sample mode to latching (regeneration) mode occurs when the clock inputs CLK and CLKX are switched, diverting current through latch-enable transistor Q106 into cross-coupled transistors Q101, Q102 and thereby enabling positive feedback (regeneration).

In the prior art comparator of FIG. 2, the basic regenerative loop, or latching circuit, includes cross-coupled transistors Q201, Q202 and resistors R201 and R202.

During sample mode, input signals IN and INX are input into the base of transistors Q203 and Q204, respectively. Output signals OUT and OUTX are taken from the collectors Q203 and Q204, respectively. The input voltage difference at the bases of Q203 and Q204 is coupled into resistors R201 and R202 to become the initial input voltage of the latching circuit upon transition from sample mode to latching mode. During sample mode, current from current source $I_S$201 passes through switching transistor Q205 and degenerate resistors R205 and R206 to provide voltage gain from input to output. Transition from sample mode to latching (regeneration) mode occurs when the clock inputs CLK and CLKX are switched, diverting current through latch-enable transistor Q206 into cross-coupled transistors Q205, Q206 and thereby enabling positive feedback.

In the comparator circuits of FIG. 1 and FIG. 2, the rate of regeneration when positive feedback is enabled is determined by the rate at which the voltage difference between the collector terminals of the cross-coupled transistors (Q101 and Q102, or Q201 and Q202) can change. This rate is determined by factors including the bias current, limited by the current sources ($I_S$101 or $I_S$201) for pulling down, and the resistors (R101 and R102, or R201 and R202) for pulling up, to drive the collector terminals of the cross-coupled transistors (Q101 and Q102, or Q201 and Q202); and the total capacitance at the collector terminals of Q103 and Q104, or Q203 and Q204.

The regeneration speed is therefore effectively limited by an effective RC time constant involving resistors R101 and R102, or R201 and R202, and the parasitic capacitance of the cross-coupled transistors (Q101 and Q102, or Q201 and Q202).

Figure 3:
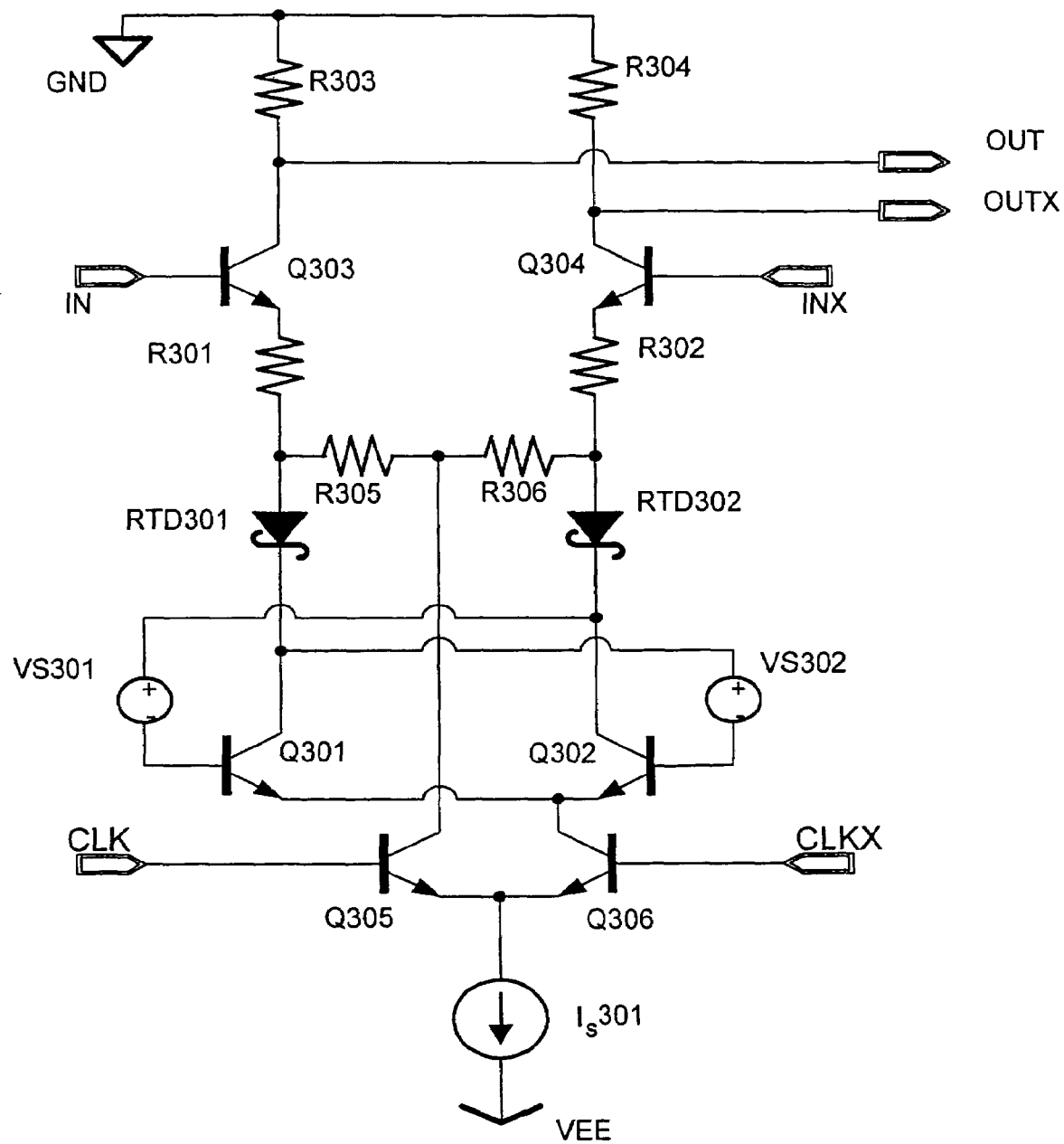
FIG. 3 shows an abbreviated circuit diagram of a comparator with resonant tunneling diodes, according to an embodiment.

FIG. 3 shows a comparator with resonant tunneling diodes according to an embodiment of the present specification.

The regenerative loop, or cross-coupled regenerative latch, includes Bipolar Junction Transistors (BJT) Q301, and Q302, as well as resonant tunneling diodes RTD301 and RTD302 inserted in series with resistors R301 and R302. The anode of the first resonant tunneling diode RTD301 connects to an end of resistor R301. The anode of the second resonant tunneling diode RTD302 connects to an end of resistor R302.

Input signals IN and INX are input into the bases of the transistors Q303 and Q304, respectively. Output signals OUT and OUTX are taken from the collectors of Q303 and Q304, respectively. A bias voltage source VS301 connects to the base of Q301 and the cathode of the second resonant tunneling diode RTD302. Similarly, a bias voltage source VS302 connects the base of Q302 and the cathode of the first resonant tunneling diode RTD301. Voltage sources VS301 and VS302 serve to bias the cross-coupled regenerative latch transistors Q301 and Q302.

During sample mode, the input voltage difference at the bases of Q303 and Q304 couples into resistors R301 and R302 to become the initial voltage of the cross-coupled regenerative latch transistors Q301 and Q302. Current from current source $I_S301$ passes through switching transistor Q305 and resistors R305 and R306 to maintain circuit voltages at appropriate levels. Transition from sample mode to latching (regeneration) mode occurs when the clock inputs CLK and CLKX switch, diverting current into latch-enable transistor Q306 into cross-coupled transistors Q305, Q306 and thereby enabling positive feedback.

As previously described, tunneling diodes RTD301 and RTD302 are in series with resistors R301 and R302. Tunneling diodes exploit resonant tunneling to provide forward-bias characteristics. When a small forward-bias voltage is applied across a tunnel diode, it begins to conduct current. As the voltage is increased, the current increases and reaches a peak value, called the peak current ($I_p$). If the voltage is increased a little more, the current actually decreases until it reaches a low point called the valley current ($I_v$). If the voltage is increased further yet, the current begins to increase again, this time without decreasing into another "valley." The forward voltages necessary to drive a tunnel diode to $I_p$ and $I_v$ are known as peak voltage ($V_p$) and valley voltage ($V_v$), respectively. The region where current is decreasing while applied voltage is increasing (between $V_p$ and $V_v$ on the horizontal scale) is known as the region of negative resistance. This negative resistance of RTD301 and RTD302 reduces the regenerative time constant RC by effectively reducing the (R) of resistors R301 and R302, providing faster regeneration than available with the comparator circuit in FIG. 1 and FIG. 2.

The comparator in FIG. 3 is applicable to a Delta-Sigma Analog-to-Digital Converter (ADC). A Delta-Sigma ADC uses a low-resolution ADC (normally a comparator) with an analog loop filter inside a feedback loop to shape the quantization noise out of the signal bandwidth. Due to the super-linear property of the 1-bit ADC (comparator), this type of ADC can achieve very high linearity and resolution in the signal bandwidth. Normally, the sampling rate of the Delta-Sigma ADC is limited by the speed of the 1-bit ADC (comparator). With the RTD comparator of FIG. 3, implemented with Indium Phosphide Heterojunction Bipolar Transistor (InP HBT) technology, a sampling rate of 40 GHz can be achieved.

The present comparator is also applicable to other types of high-speed ADCs, including both successive approximation and flash converters.

Figure 4:
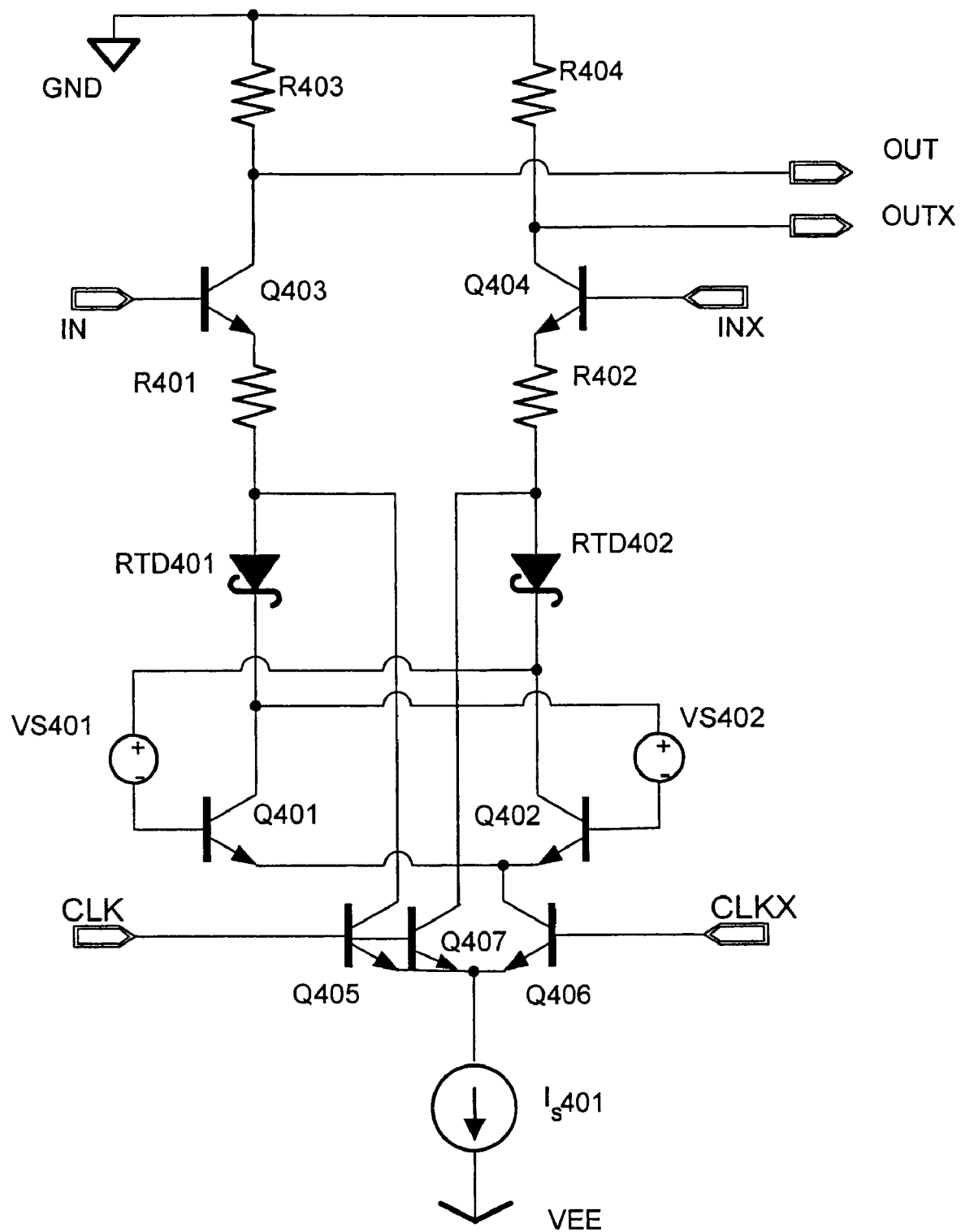
FIG. 4 shows an abbreviated circuit diagram of a comparator with resonant tunneling diodes, according to an alternative embodiment.

FIG. 4 shows a comparator with resonant tunneling diodes according to an alternative embodiment having separate sample-mode switching transistors Q405 and Q407 for each side of the comparator.

The regenerative loop, or cross-coupled regenerative latch, includes transistors Q401, and Q402, as well as resonant tunneling diodes RTD401 and RTD402 inserted in series with resistors R401 and R402. The anode of the first resonant tunneling diode RTD401 connects to an end of resistor R401. The anode of the second resonant tunneling diode RTD402 connects to an end of resistor R402.

Input signals IN and INX are input into the bases of the transistors Q403 and Q404, respectively. Output signals OUT and OUTX are taken from the collectors of Q403 and Q404, respectively. A bias voltage source VS401 connects to the base of Q401 and the cathode of the second resonant tunneling diode RTD402. Similarly, a bias voltage source VS402 connects the base of Q402 and the cathode of the first resonant tunneling diode RTD401. Voltage sources VS401 and VS402 serve to bias the cross-coupled regenerative latch transistors Q401 and Q402.

During sample mode, the input voltage difference at the bases of Q403 and Q404 couples into resistors R401 and R402 to become the initial voltage of the cross-coupled regenerative latch transistors Q401 and Q402. Current from current source $I_S401$ passes through switching transistors Q405 and Q407 into Q403 and Q404 to act as emitter-followers. Transition from sample mode to latching (regeneration) mode occurs when the clock inputs CLK and CLKX switch, diverting current into latch-enable transistor Q406 into cross-coupled transistors Q401, Q402 and thereby enabling positive feedback.

The embodiment of FIG. 4 offers advantage over that of FIG. 3 in that the initial voltage difference at the latching transistors are bigger. It provides a faster regeneration rate and higher sensitivity for this comparator.

Figure 5:
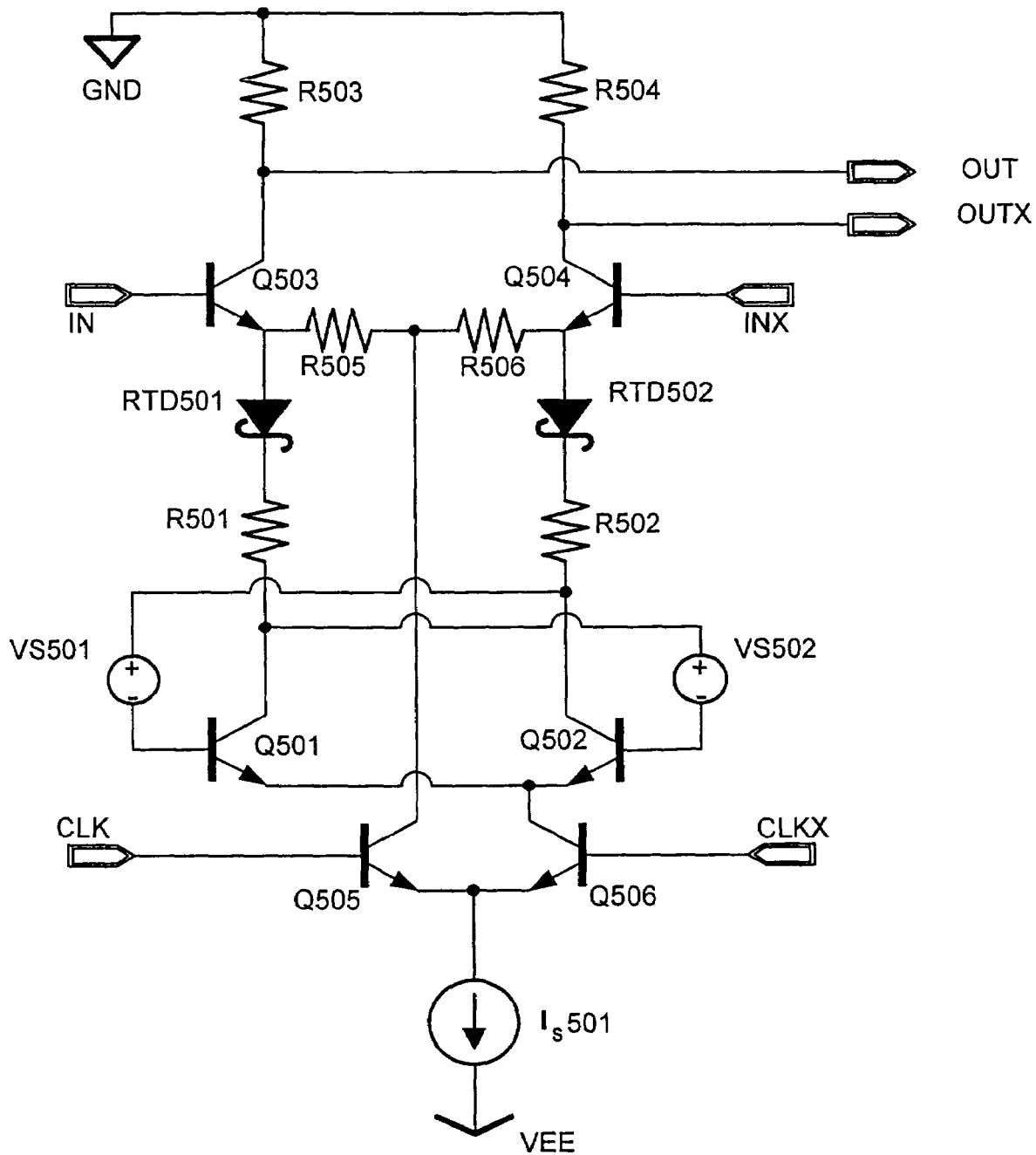
FIG. 5 shows an abbreviated circuit diagram of a comparator with resonant tunneling diodes, according to another alternative embodiment.

FIG. 5 shows another embodiment of the analog comparator. The cathode of the first resonant tunneling diode RTD501 connects to the first end of resistor R501. The cathode of the second resonant tunneling diode RTD502 connects to the first end of resistor R502. Resistor R505 connects to the emitter of Q503. Resistor R506 connects to the emitter of Q504. Resistors R505 and R506 interconnect the emitters of Q503 and Q504 with sample mode switch Q505.

In sample mode, the current from current source $I_S501$ is steered through transistor Q505 and split by resistors R505 and R506 into emitters of Q503 and Q504, respectively. The input voltage difference at the bases of Q503 and Q504 is coupled into the collectors of the latch transistors Q501 and Q502.

In latching mode, current from current source $I_S501$ is steered through transistor Q506 into cross coupled latch transistors Q501 and Q502, which resolve the signal. Information from latch transistors Q501 and Q502 is then amplified by Q503 and Q504, now operating as cascode amplifiers, into the output loads R503 and R504 and output terminals OUT and OUTX.

Figure 6:
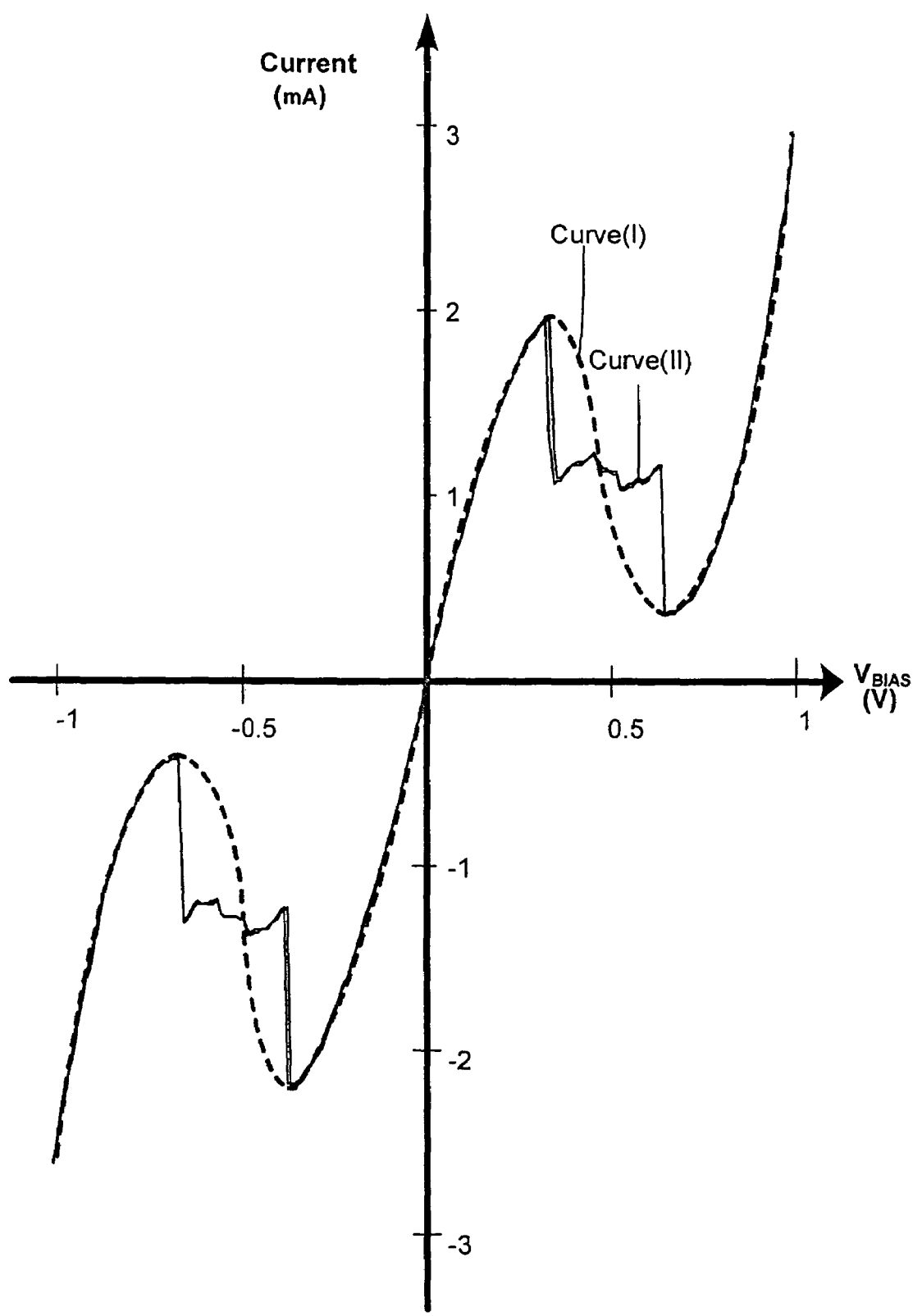
FIG. 6 is a current versus voltage plot showing negative resistance of a resonant tunneling diode.

FIG. 6 shows an I–V curve of a RTD diode (such as RTD302, FIG. 3). Curve (I) is the ideal curve. Curve (II) is the measured curve. The RTD diode shows a negative resistance between 0.3 to 0.7V. The comparators in FIGS. 3–5 and 7–9 use the negative resistance in this region to reduce the associated time constant.

Figure 7:
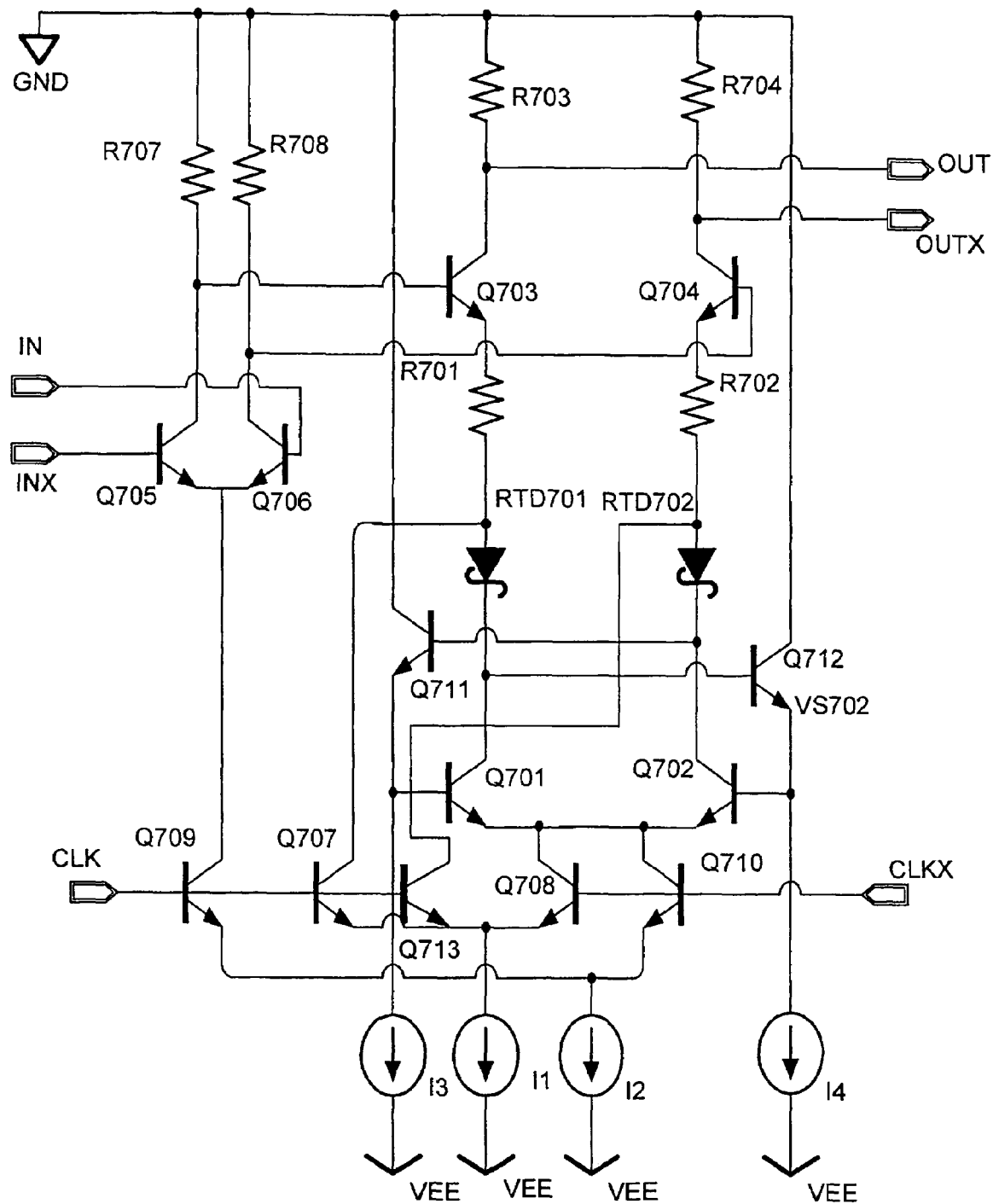
FIG. 7 shows an abbreviated circuit diagram of a comparator with resonant tunneling diodes, according to an embodiment having a differential preamplifier.

FIG. 7 shows another embodiment of the comparator. In FIG. 7, differences between the input signals IN and INX are amplified by a differential pair Q705 and Q706 during sample mode, and couple through transistors Q703 and Q704 to the latching transistors Q701 and Q702.

The latching circuit includes cross-coupled latch transistors Q701–Q702 with emitter-follower bias transistors Q711 and Q712 to avoid saturation of Q701 and Q702. Also included are sample mode current steering transistors Q707 and Q713 and latch mode current steering transistor Q708.

The voltage difference between CLK and CLKX is the "clock voltage". The clock voltage controls whether the comparator is sensing the voltage difference at inputs IN and INX (sample mode) or has positive feedback enabled so that it regenerates to a full logic swing at the outputs (latching mode).

When the clock voltage is high, the comparator in FIG. 7 is in sample mode. Current from the current source I2 is steered through transistor Q709 into the input differential pair Q705 and Q706. The current from the current source I1 is steered through sample-mode current-steering transistors Q707 and Q713 the emitters of Q703 and Q704.

Current source I3 is used to bias emitter follower Q711. Current source I4 is used to bias emitter follower Q712. In the sample mode, the input voltage between IN and INX is amplified by differential amplifier Q705–Q706+R707–R708 and the amplified signal is applied to the bases of Q703 and Q704. The amplified signal voltage difference at the bases of Q703 and Q704 is approximately replicated at the emitters of these transistors. This amplified signal then appears at the collectors of the latch transistors Q701 and Q702.

When the clock voltage is switched low, the comparator in FIG. 7 is in latching (or regeneration mode), and the currents from current sources I2 and I1 are steered through transistors Q708 and Q710 into a node common to emitters Q701 and Q702. This causes the cross-coupled regenerative latch transistors Q701 and Q702 to become active so that the voltage difference between the collectors of Q701 and Q702 will be regeneratively amplified to the point that nearly all of the current flows through one of the transistors Q701 or Q702 into the cascode transistors Q703 and Q704 and thence into an output load at OUT and OUTX.

The rate of regeneration in the comparator of FIG. 7 is limited by an effective RC time constant formed from parasitic capacitance of the transistors Q701, Q702 and Q711, Q712 and by resistance of the resistors R701, R702. However, since RTD diodes RTD701 and RTD702 are in series with R701 and R702, their negative resistance reduces the effective RC time constants of R701 and R702, leading to a faster regeneration time.

In the embodiment of FIG. 7, the input signal is isolated from the bases of Q703 and Q704 when the clock is low, so that changes in the input voltage do not disturb the state of the latch. Each VEE provides negative power supply for the cross-coupled regenerative latch.

Figure 8:
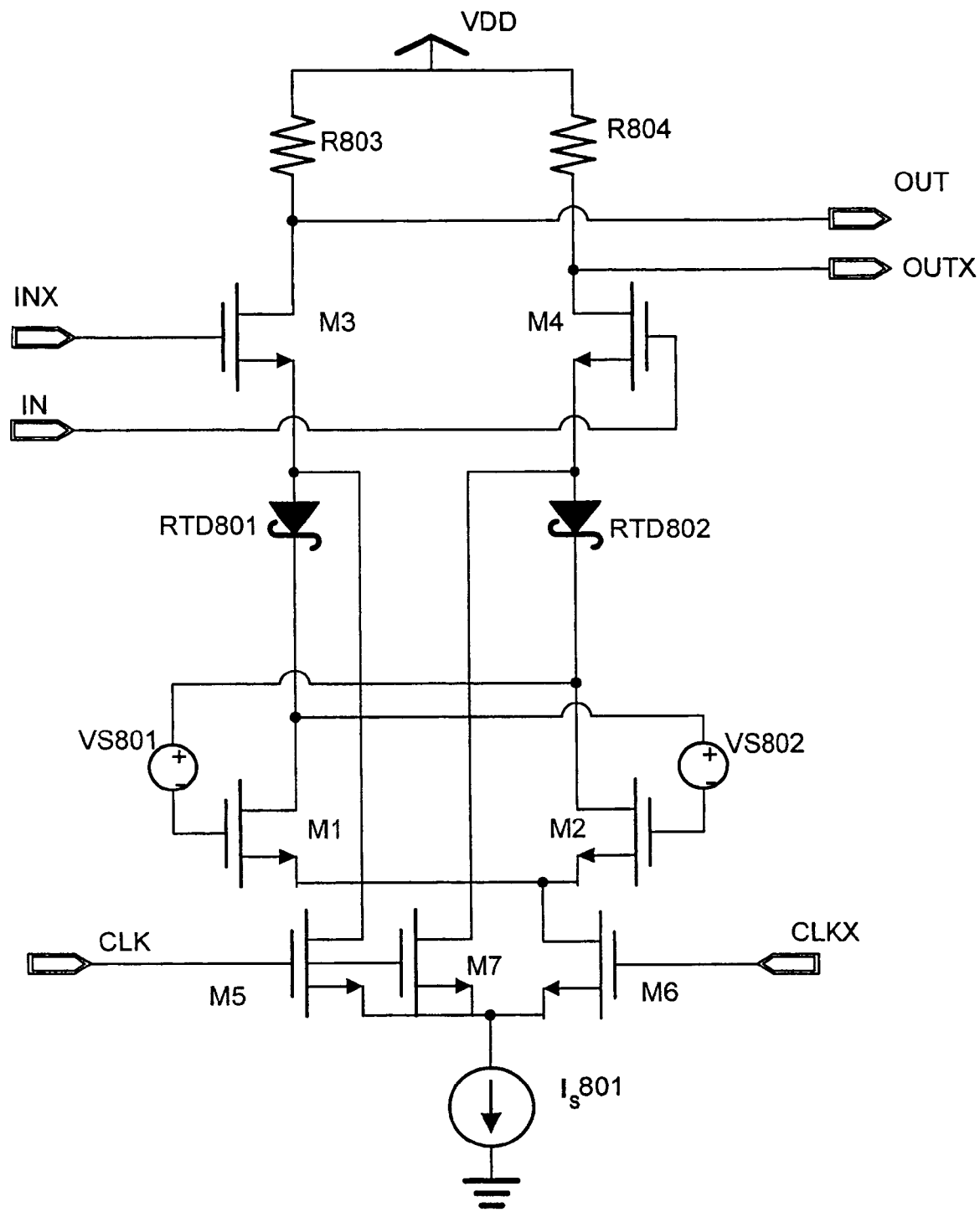
FIG. 8 shows an abbreviated circuit diagram of a comparator with resonant tunneling diodes, according to an embodiment having insulated-gate field-effect transistors.

FIG. 8 shows an alternative embodiment of the comparator of the present specification. The circuit in FIG. 8 performs the same function as the circuits in FIGS. 3–5 except that it does so using field effect transistors instead of bipolar transistors. In FIG. 8 the regenerative loop, or cross-coupled regenerative latch, comprises transistors M1, M2 as well as resonant tunneling diodes RTD801 and RTD802. Input signals IN and INX are input into the gates of the transistors M3 and M4, respectively. Output signals OUT and OUTX are taken from the drains of M3 and M4, respectively. A voltage source VS801 connects to the gate of M1 and RTD802. A voltage source VS802 connects to the gate of M2 and RTD801. Voltage sources VS801 and VS802 serve to bias the cross-coupled regenerative latch of FIG. 8. The input voltage difference at the gates of M3 and M4 couples into tunneling diodes RTD801 and RTD802 to become the initial input voltage of the cross-coupled regenerative latch upon entry into latching mode. Upon entry to latching mode, tunneling diodes RTD801 and RTD802 effectively reduce parasitic resistances of transistors M3 and M4 to allow fast resolution of weak differential signals. Transistors M5 and M7 operate to feed current into M3 and M4, which operate as source followers in sample mode. Transistors M5 and M7 shut off; and M6 operates to enable the cross-coupled regenerative latch of M1 and M2 in latching mode.

Each transistor M1, M2, M3, M4, M5, M6 and M7 is an N-channel field effect transistor (FET). VDD provides positive power supply for the circuit.

Figure 9:
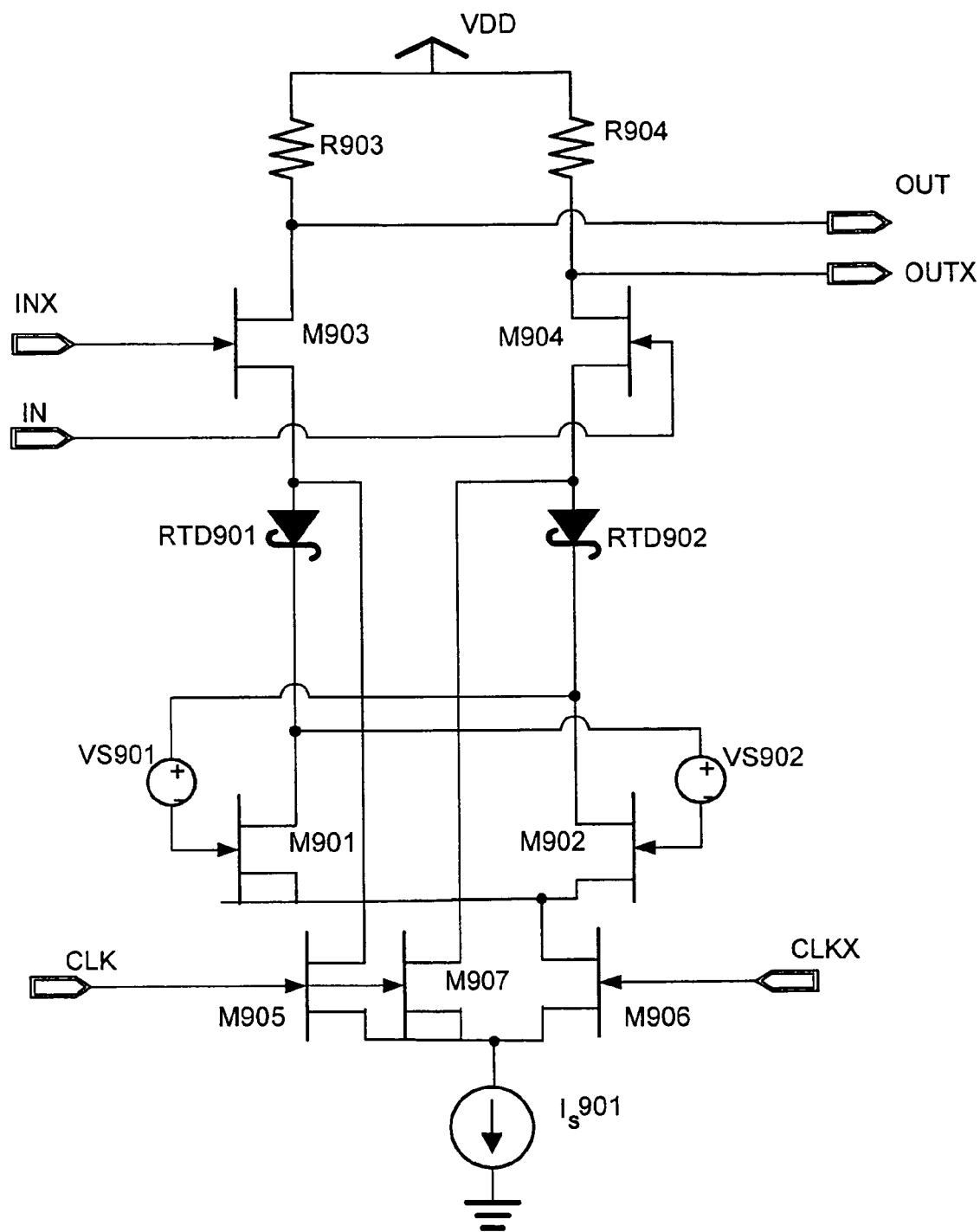
FIG. 9 shows an abbreviated circuit diagram of a comparator with resonant tunneling diodes, according to an embodiment having junction field-effect transistors.

FIG. 9 shows an alternative embodiment of the comparator of the present specification. The circuit in FIG. 9 performs similar function as the circuits in FIGS. 3–5 using junction field effect transistors. In FIG. 9 the regenerative loop, or cross-coupled regenerative latch, comprises transistors M901, M902 as well as resonant tunneling diodes RTD901 and RTD902. Input signals IN and INX are input into the gates of the transistors M903 and M904, respectively. Output signals OUT and OUTX are taken from the drains of M903 and M904, respectively. A voltage source VS901 connects to the gate of M901 and RTD902. A voltage source VS902 connects to the gate of M902 and RTD901. Voltage sources VS901 and VS902 serve to bias the cross-coupled regenerative latch of FIG. 9. The input voltage difference at the gates of M903 and M904 couples into diodes RTD901 and RTD902 to become the initial input voltage of the cross-coupled regenerative latch upon entry into latching mode. Upon entry to latching mode, tunneling diodes RTD901 and RTD902 effectively reduce parasitic resistances of transistors M903 and M904 to allow fast resolution of weak differential signals. Transistors M905 and M907 operate to feed current into M903 and M904, which operate as source followers in sample mode. Transistors M905 and M907 shut off; and M906 operates to enable the cross-coupled regenerative latch of M901 and M902 in latching mode.

Each transistor M901, M902, M903, M904, M05, M906 and 907 is an N-channel junction field effect transistor (JFET). VDD provides positive power supply for the circuit.

For purposes of this document, a "control terminal" of a transistor shall include the base of a bipolar transistor, or the gate of a field-effect transistor.

The embodiments according to FIGS. 3–5, 7–9 have been illustrated in terms of bipolar junction transistors, N-channel metal-oxide-semiconductor (N-MOS) FETs, and N-channel JFETs. Those skilled in the art appreciate that equivalent circuits may be implemented with PNP transistors, with NPN or PNP bipolar or heterojunction bipolar transistors and resonant tunneling diodes fabricated in semiconductor materials other than Indium Phosphide, such as Silicon, Silicon-Germanium, or Gallium Arsenide, with FETs or JFETs of either polarity, or with a mixture of these device types. Similarly, equivalent circuits may be implemented in Gallium Arsenide metal-semiconductor field-effect transistor (MESFET) technology.

Those skilled in the art should appreciate that, in those topologies having a resistor and tunneling diode in series without connections between the resistor and tunneling diode, such as that illustrated in FIG. 5, the tunneling diode and resistor may be swapped without impairing circuit function.

Changes may be made in the above description without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the method and system, which, as a matter of language, might be said to fall there between.

What is claimed is:

1. A comparator having a sample mode end a latching mode, a first comparator input, a second comparator input, and an output, the comparator comprising:
   a cross-coupled regenerative latch for regenerating, during a latching mode, a difference signal indicative of a difference between the first comparator input and the second comparator input, said cross-coupled regenerative latch comprising:
   a first and a second resistor,
   a first and a second resonant tunneling diode, wherein the first tunneling diode is coupled in series with the first resistor to form a first resistor-diode pair, and the second tunneling diode is coupled in series with the second resistor to form a second resistor-diode pair, and
   a first end a second transistor, wherein a collector of the first transistor and a base of the second transistor are connected to a first terminal of the first resistor-diode pair, a collector of the second transistor and a base of the first transistor are connected to a first terminal of the second resistor-diode pair, and an emitter of the first transistor is connected to an emitter of the second transistor;
   a third transistor coupled to the second terminal of the first resistor-diode pair;
   a fourth transistor coupled to the second terminal of the second resistor-diode pair; and
   a current switch circuit for switching the comparator between the sample mode and the latching mode;
   wherein the third and the fourth transistors couple the difference signal into the latch during the sample mode and are operable as a cascode amplifier to couple a latch state to the output during the latching mode.

2. The comparator of claim 1, further comprising a first current generator connected to the current switch circuit, the current switch circuit steering current from the first current generator into said regenerative latch during the latching mode.

3. The comparator of claim 2, wherein the current switch circuit steers current from the first current generator into said third and fourth transistors during sample mode to bias said third and fourth transistors during sample mode.

4. The comparator of claim 2, further comprising an input buffer circuit connected to said third and fourth transistors, said input buffer circuit receiving first and second input signals and isolating said first and second input signals from said regenerative latch during said latching mode.

5. The comparator of claim 2, further comprising a second current generator connected to the current switch circuit, the current switch circuit steering current from said second current generator into said regenerative latch during said latching mode.

6. The comparator of claim 1 further comprising a differential amplifier coupled to amplify a difference of the first and second comparator inputs to form an input difference signal, and to present the input difference signal to the regenerative latch during sample mode.

7. The comparator of claim 6 wherein the first and second transistors are selected from the group consisting of heterojunction bipolar, bipolar, and field-effect transistors.

8. The comparator of claim 7 wherein the first and second transistors are selected from the group consisting of metal-oxide semiconductor field-effect transistors, junction field effect transistors, and metal-semiconductor field-effect transistors.

9. A comparator comprising:
   a first, second, third, fourth, fifth, sixth, and seventh transistor, each transistor having a first terminal, a second terminal, and a control terminal;
   a current source;
   a first and a second resistor-diode pair, each of the first and second resistor-diode pair comprising a tunneling diode and a resistor coupled in series;
   where the first terminal of the first transistor is coupled to the control terminal of the second transistor, the first terminal of the second transistor is coupled to the control terminal of the first transistor, and the second terminal of the second transistor is coupled to the second terminal of the first transistor;
   where a first terminal of the first resistor-diode pair is coupled to the first terminal of the first transistor, and a first terminal of the second resistor-diode pair is coupled to the first terminal of the second transistor;
   where a second terminal of the first resistor-diode pair is coupled to the second terminal of the fifth transistor, a second terminal of the second resistor-diode pair is coupled to the second terminal of the sixth transistor;
   where the current source is coupled to the second terminal of the third transistor, and the first terminal of the third transistor is coupled to the second terminal of the first and second transistors, and the current source is coupled to the second terminal of the fourth transistor and the second terminal of the seventh transistor; and
   where the first terminal of the fourth transistor is coupled to provide bias current to the second terminal of the fifth transistor during sample mode.

10. The comparator of claim 9 where the first terminal of the seventh transistor is coupled to provide bias current to the second terminal of the sixth transistor during sample mode.

11. The comparator of claim 9 where a first terminal of a seventh transistor is coupled to provide bias current to the second terminal of the sixth transistor, the second terminal of the seventh transistor being coupled to the second terminal of the fourth transistor and the control terminal of the seventh transistor being coupled to the control terminal of the fourth transistor.

12. A comparator comprising:
   a first, second, third, fourth, fifth, sixth, and seventh transistor, each transistor having a first terminal, a second terminal, and a control terminal;
   a current source;
   a first and a second resistor-diode pair, each of the first and second resistor-diode pair comprising a tunneling diode mid a resistor coupled in series;
   where the first terminal of the first transistor is coupled to the control terminal of the second transistor, the first terminal of the second transistor is coupled to the control terminal of the first transistor, and the second terminal of the second transistor is coupled to the second terminal of the first transistor;

where a first terminal of the first resistor-diode pair is coupled to the first terminal of the first transistor, and a first terminal of the second resistor-diode pair is coupled to the first terminal of the second transistor;

where a second terminal of the first resistor-diode pair is coupled to the second terminal of the fifth transistor, a second terminal of the second resistor-diode pair is coupled to the second terminal of the sixth transistor;

where the current source is coupled to the second terminal of the third transistor, and the first terminal of the third transistor is coupled to the second terminal of the first and second transistors, and the current source is coupled to the second terminal of the fourth transistor and the second terminal of the seventh transistor; and where the first terminal of the fourth transistor is coupled to provide bias current to the second terminal of the fifth transistor;

where the first terminal of the seventh transistor is coupled to provide bias current to the second terminal of the sixth transistor.

13. A comparator comprising:

a first, second, third, fourth, fifth, and sixth, transistor, each transistor having a first terminal, a second terminal, and a control terminal;

a current source;

a first and a second tunneling diode;

where the first terminal of the first transistor is coupled to the control terminal of the second transistor, the first terminal of the second transistor is coupled to the control terminal of the first transistor, and the second terminal of the second transistor is coupled to the second terminal of the first transistor;

where a first terminal of the first tunneling diode is coupled to the first terminal of the first transistor, and a first terminal of the second tunneling diode is coupled to the first terminal of the second transistor, where a second terminal of the first tunneling diode is coupled to the second terminal of the fifth transistor, a second terminal of the second tunneling diode is coupled to the second terminal of the sixth transistor;

where the current source is coupled to the second terminal of the third transistor, and the first terminal of the third transistor is coupled to the second terminal of the first and second transistors, and the current source is coupled to the second terminal of the fourth transistor; and where the first terminal of the fourth transistor is coupled to provide bias current to the second terminal of the fifth transistor.

14. The comparator of claim 13 further comprising a seventh transistor, where a first terminal of the seventh transistor is coupled to provide bias current to the second terminal of the sixth transistor, and where a second terminal of the seventh transistor is coupled to the current source.

15. The comparator of claim 13 wherein the first terminal of the fourth transistor is coupled to provide bias current to the second terminal of the fifth transistor through a resistor, and the first terminal of the fourth transistor is coupled to provide bias current to the second terminal of the sixth transistor through a resistor.

16. The comparator of claim 13 wherein the first terminal of the first tunneling diode is coupled to the first terminal of the first transistor through a resistor, and the first terminal of the second tunneling diode is coupled to the first terminal of the second transistor through a resistor.

17. The comparator of claim 13 wherein the second terminal of the first tunneling diode is coupled to the second terminal of the fifth transistor through a resistor, and where the second terminal of the second tunneling diode is coupled to the second terminal of the sixth transistor through a resistor.

18. The comparator of claim 13 wherein the comparator is fabricated using indium phosphide heterojunction bipolar transistors.

19. The comparator of claim 13 wherein the comparator is fabricated using silicon bipolar transistors.

* * * * *